US009710595B2

(12) United States Patent
Conzola et al.

(10) Patent No.: US 9,710,595 B2
(45) Date of Patent: Jul. 18, 2017

(54) MULTI-VIEW USER INTERFACE FOR SERVER CABLING DISPLAY

(75) Inventors: Vincent C. Conzola, Cary, NC (US); Todd Eischeid, Cary, NC (US); Timothy Meserth, Durham, NC (US); Mark E. Molander, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 1574 days.

(21) Appl. No.: 12/711,592

(22) Filed: Feb. 24, 2010

(65) Prior Publication Data

US 2011/0209082 A1    Aug. 25, 2011

(51) Int. Cl.
| | |
|---|---|
| *G06F 3/048* | (2013.01) |
| *G06F 3/0481* | (2013.01) |
| *G06F 17/50* | (2006.01) |
| *G06F 3/0482* | (2013.01) |
| *G09G 5/14* | (2006.01) |
| *G06F 9/44* | (2006.01) |

(52) U.S. Cl.
CPC .......... *G06F 17/509* (2013.01); *G06F 3/0481* (2013.01); *G06F 3/0482* (2013.01); *G06F 9/4443* (2013.01); *G09G 5/14* (2013.01)

(58) Field of Classification Search
CPC ................. G06F 3/0481; G06F 9/4443; G06F 2203/04803; G06F 3/0482; G09G 5/14
USPC ........................................ 715/733, 735, 738
See application file for complete search history.

(56) References Cited

U.S. PATENT DOCUMENTS

| | | | |
|---|---|---|---|
| 4,985,855 A | 1/1991 | Aldrich et al. | |
| 5,019,992 A | 5/1991 | Brown et al. | |
| 5,021,968 A | 6/1991 | Ferketic | |
| 5,138,698 A | 8/1992 | Aldrich et al. | |
| 5,295,244 A | 3/1994 | Dev et al. | |
| 5,636,138 A | 6/1997 | Gilbert et al. | |
| 5,831,610 A * | 11/1998 | Tonelli et al. | 715/735 |
| 5,850,539 A | 12/1998 | Cook et al. | |
| 5,883,621 A * | 3/1999 | Iwamura | 725/37 |
| 5,926,463 A * | 7/1999 | Ahearn et al. | 370/254 |
| 5,995,729 A * | 11/1999 | Hirosawa et al. | 703/1 |
| 6,594,696 B1 * | 7/2003 | Walker et al. | 709/223 |
| 6,721,414 B1 | 4/2004 | Rojas et al. | |
| 6,867,768 B2 | 3/2005 | Sakakura et al. | |
| 7,054,793 B2 | 5/2006 | Moritz et al. | |
| 7,062,719 B2 | 6/2006 | Zirojevic et al. | |

(Continued)

FOREIGN PATENT DOCUMENTS

JP    2000-082082    3/2000

*Primary Examiner* — Tuyetlien T Tran
(74) *Attorney, Agent, or Firm* — Suiter Swantz pc llo

(57) ABSTRACT

Methods and systems for displaying graphical representations of server system cabling in the data center may include, but are not limited to operations for: generating a pattern view of a cabling scheme; generating a routing view of a cabling scheme; receiving a request to display a pattern view of a cabling scheme; transmitting data representing the pattern view of the cabling scheme; receiving a request to display a routing view of the cabling scheme; and transmitting data representing the routing view of the cabling scheme. The display of various graphical representations of the cabling scheme may facilitate various service operations associated with the cabling. Such service operations may include installation, maintenance, trouble shooting and optimization for a cabled server cluster.

32 Claims, 15 Drawing Sheets

(56) References Cited

U.S. PATENT DOCUMENTS

| | | | |
|---|---|---|---|
| 7,234,115 B1* | 6/2007 | Sprauve et al. | 715/746 |
| 7,310,774 B1* | 12/2007 | Arquie | H04L 41/12 |
| | | | 715/734 |
| 7,315,985 B1* | 1/2008 | Gauvin et al. | 715/734 |
| 7,360,158 B1* | 4/2008 | Beeman | G06Q 30/02 |
| | | | 715/705 |
| 7,558,705 B1 | 7/2009 | Hughes et al. | |
| 8,161,393 B2* | 4/2012 | Gillingham et al. | 715/736 |
| 2001/0025377 A1* | 9/2001 | Hinderks | 725/109 |
| 2003/0037136 A1* | 2/2003 | Labovitz et al. | 709/224 |
| 2003/0046657 A1 | 3/2003 | White | |
| 2003/0055932 A1* | 3/2003 | Brisse | 709/223 |
| 2004/0186701 A1* | 9/2004 | Aubin et al. | 703/13 |
| 2005/0027890 A1* | 2/2005 | Nelson et al. | 709/250 |
| 2005/0128940 A1* | 6/2005 | Wen et al. | 370/216 |
| 2005/0135056 A1 | 6/2005 | Suzuki et al. | |
| 2005/0152284 A1* | 7/2005 | Kotha et al. | 370/254 |
| 2005/0201380 A1* | 9/2005 | Saleh et al. | 370/395.2 |
| 2005/0235243 A1* | 10/2005 | Hachiya | G06F 17/5077 |
| | | | 716/126 |
| 2005/0278445 A1* | 12/2005 | Quang et al. | 709/226 |
| 2005/0286235 A1* | 12/2005 | Randall et al. | 361/724 |
| 2006/0112297 A1* | 5/2006 | Davidson | 714/2 |
| 2006/0117208 A1* | 6/2006 | Davidson | 714/4 |
| 2006/0151190 A1 | 7/2006 | Rasmussen et al. | |
| 2007/0038415 A1 | 2/2007 | Okada et al. | |
| 2007/0293236 A1* | 12/2007 | Cox | H04Q 1/06 |
| | | | 455/456.1 |
| 2008/0054154 A1 | 3/2008 | Lin | |
| 2008/0072203 A1* | 3/2008 | Bergman Reuter et al. | 716/14 |
| 2008/0154551 A1* | 6/2008 | Rodriguez | G06F 17/509 |
| | | | 703/1 |
| 2008/0255818 A1 | 10/2008 | Jefferson et al. | |
| 2008/0259816 A1* | 10/2008 | Archer et al. | 370/254 |
| 2009/0132698 A1* | 5/2009 | Barnhill, Jr. | 709/224 |
| 2009/0327903 A1* | 12/2009 | Smith et al. | 715/737 |
| 2010/0185894 A1* | 7/2010 | Herta | 714/4 |
| 2012/0146618 A1* | 6/2012 | Zelhofer et al. | 324/71.1 |

* cited by examiner

МULTI-VIEW USER INTERFACE FOR
SERVER CABLING DISPLAY

BACKGROUND

Cable management in modern server farm installations can be a very difficult time-consuming and problem-prone user task. One of the tasks in cabling is routing the cables on the left or right side of a server rack, or to cable trays above or below the server rack. It may be difficult for installation/maintenance personnel to visualize how the various ports and nodes are interconnected via the cables. Providing graphical representations of cabling schematics may facilitate during cable routing.

SUMMARY

Methods and systems for displaying graphical representations of server system cabling in the data center may include, but are not limited to operations for: generating a pattern view of a cabling scheme; generating a routing view of a cabling scheme; receiving a request to display a pattern view of a cabling scheme; transmitting data representing the pattern view of the cabling scheme; receiving a request to display a routing view of the cabling scheme; and transmitting data representing the routing view of the cabling scheme.

The display of various graphical representations of the cabling scheme may facilitate various service operations associated with the cabling. Such service operations may include installation, maintenance, trouble shooting and optimization for a cabled server cluster.

BRIEF DESCRIPTION OF THE DRAWINGS

Figure Number:
1 is a high-level block diagram of a cabling display system.
2 is a graphical representation of a cabling pattern.
3 is a high-level block diagram of a system for displaying server cabling.
4 is a user interface displaying a cabling pattern.
5 is a user interface displaying a cable routing.
6 is a user interface displaying a cabling pattern and cable routing.
7 is a user interface displaying a portion of a cabling pattern.
8 is a user interface displaying a portion of a cabling pattern.
9 is a user interface displaying a portion of a cable routing.
10 is a user interface displaying a portion of a cable routing.
11 is a high-level logic flowchart of a process.
12 is a high-level logic flowchart of a process.
13 is a high-level logic flowchart of a process.
14 is a high-level logic flowchart of a process.
15 is a high-level logic flowchart of a process.

DETAILED DESCRIPTION

Figure 1:
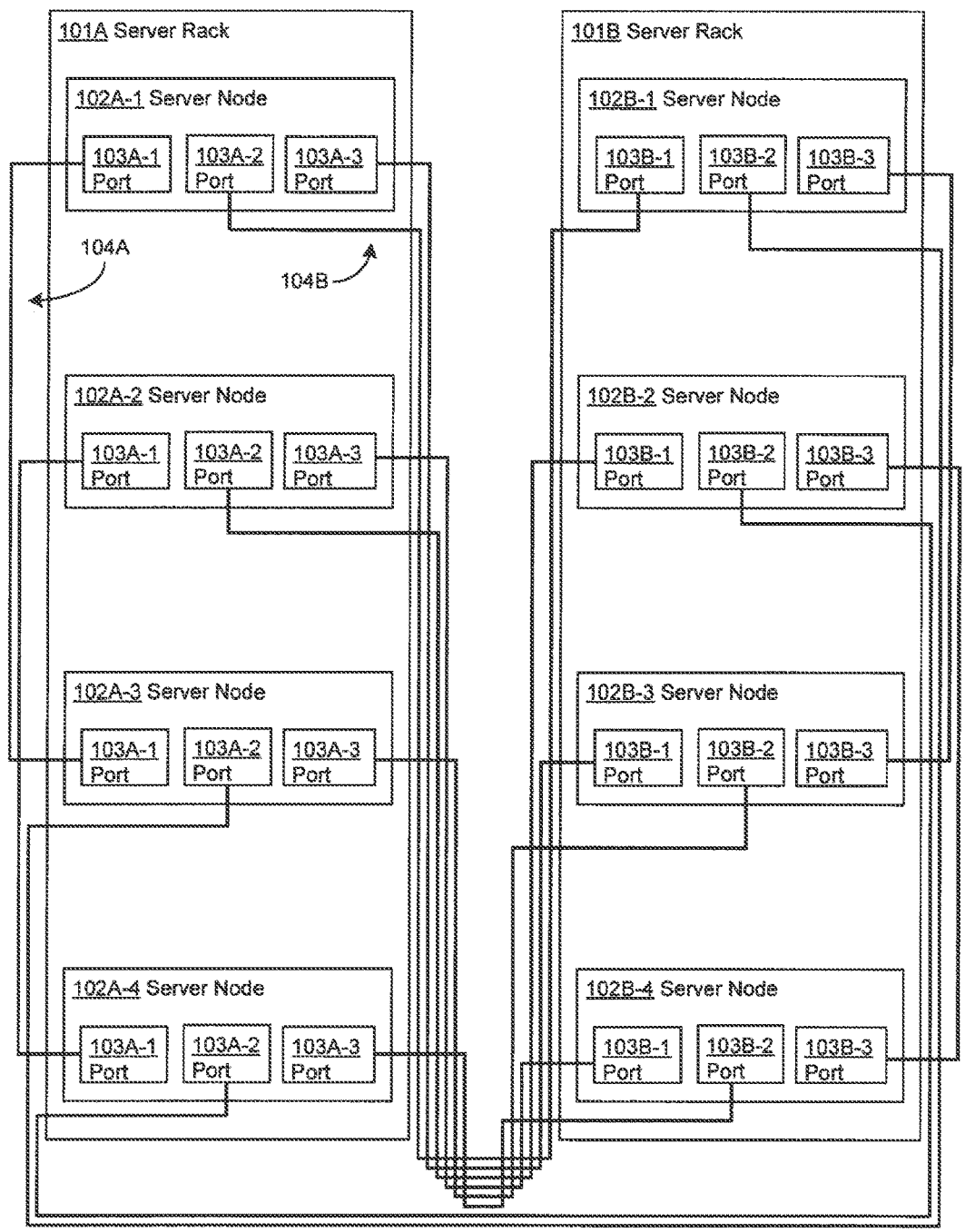

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

In today's modern server installations, there may be an extremely large number of possible cable routings for power, data, and the like. As such, inter-node connections may follow various patterns according to a cabling mapping scheme. The cabling pattern may be a function of the number of server racks, the number of server nodes within a rack, the number of server ports within a server node, level of desired quality of service, etc.

While such cabling patterns may serve to simplify the user's understanding of the interconnection of the various server nodes, it will be recognized that the complexity in the physical cabling between multiple server nodes residing on multiple server racks may grow rapidly with the addition of additional server racks. In very large systems, the cabling complexity may become such that, without computerized services, the installation and maintenance of the cabling connections may be impractical.

The display of various graphical representations of a cabling scheme may facilitate various service operations associated with the cabling. Such service operations may include installation, maintenance, trouble shooting and optimization for a cabled server cluster.

FIG. 1 illustrates an example environment in which one or more technologies may be implemented. Referring to FIG. 1, a server cluster 100 may include at least one server rack 101. Each rack 101 may include at least one server node 102. Each node 102 may include at least one server node port 103 configured to receive a network cable 104.

As shown in FIG. 1, each port 103 of a given node 102 may be connected to a unique node 102. For example, a first server node (e.g. node 102A-1) of a first server rack (e.g. rack 101A) may be operably coupled to a second server node (e.g. node 102A-3) in the first server rack (e.g. rack 101A) by a network cable (e.g. cable 104A) connected to a server node port in each server node (e.g. port 103A-1 and port 103A-1 of node 102A-1 and node 102A-3, respectively).

Similarly, the first server node (e.g. node 102A-1) of the first server rack (e.g. rack 101A) may be operably coupled to a third server node (e.g. node 102B-1) in a second server rack (e.g. rack 101B) by a network cable (e.g. cable 104B) connected to a server node port in each server node (e.g. port 103A-2 and port 103A-1 of node 102A-1 and node 102B-1, respectively). As shown in FIG. 1, the network cables 104 may be routed down the left side of a server rack (e.g. cable 104A for rack 101A) or the right side of a server rack (cable 104B for rack 101A). The cables may be routed underneath a raised floor as shown in FIG. 1 or to overhead cable trays (not shown). Such a representation of the actual cabling paths with respect to the structural features of the server cluster 100 environment (e.g. down a particular side of a server rack, under floor, overhead, etc.) of the cables in the server cluster 100 may be referred to as a routing view of the cabling.

Figure 2:
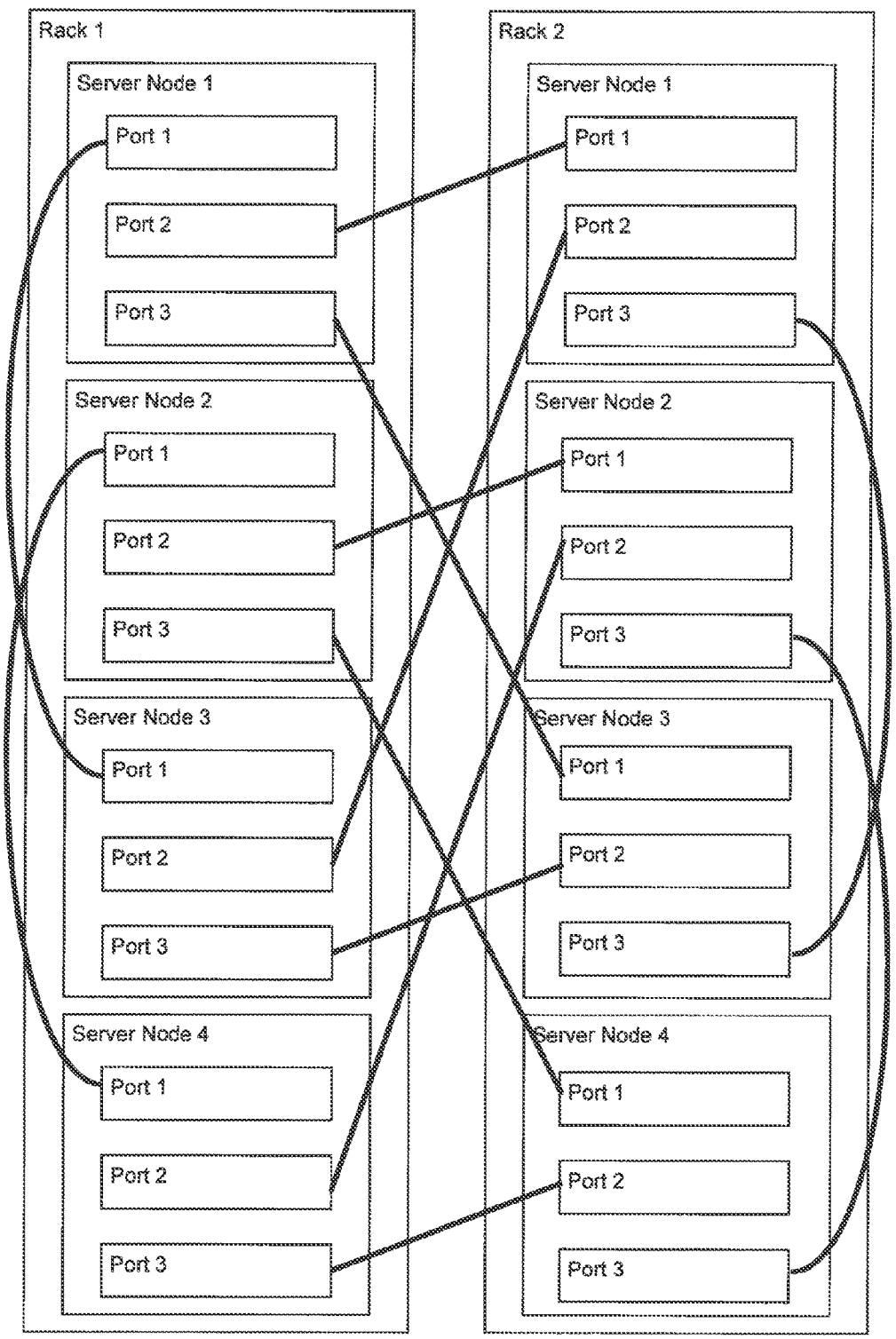

Referring to FIG. 2, an alternate cabling representation is shown. In this representation, the cabling representation may be characterized by depicting substantially direct interconnects between various ports as compared to the indirect interconnects depicted in the cable routing view of FIG. 1. This cabling representation may visually reflect a "stitching"-type pattern resulting from the cabling mapping referenced above. Such a representation of the cabling may be referred to as a pattern view of the cabling. The cabling pattern representation may allow a user to better visualize the patterned nature of the inter-node connections in an abstract manner independent of the actual physical cable routing paths (as shown in FIG. 1).

Figure 3:
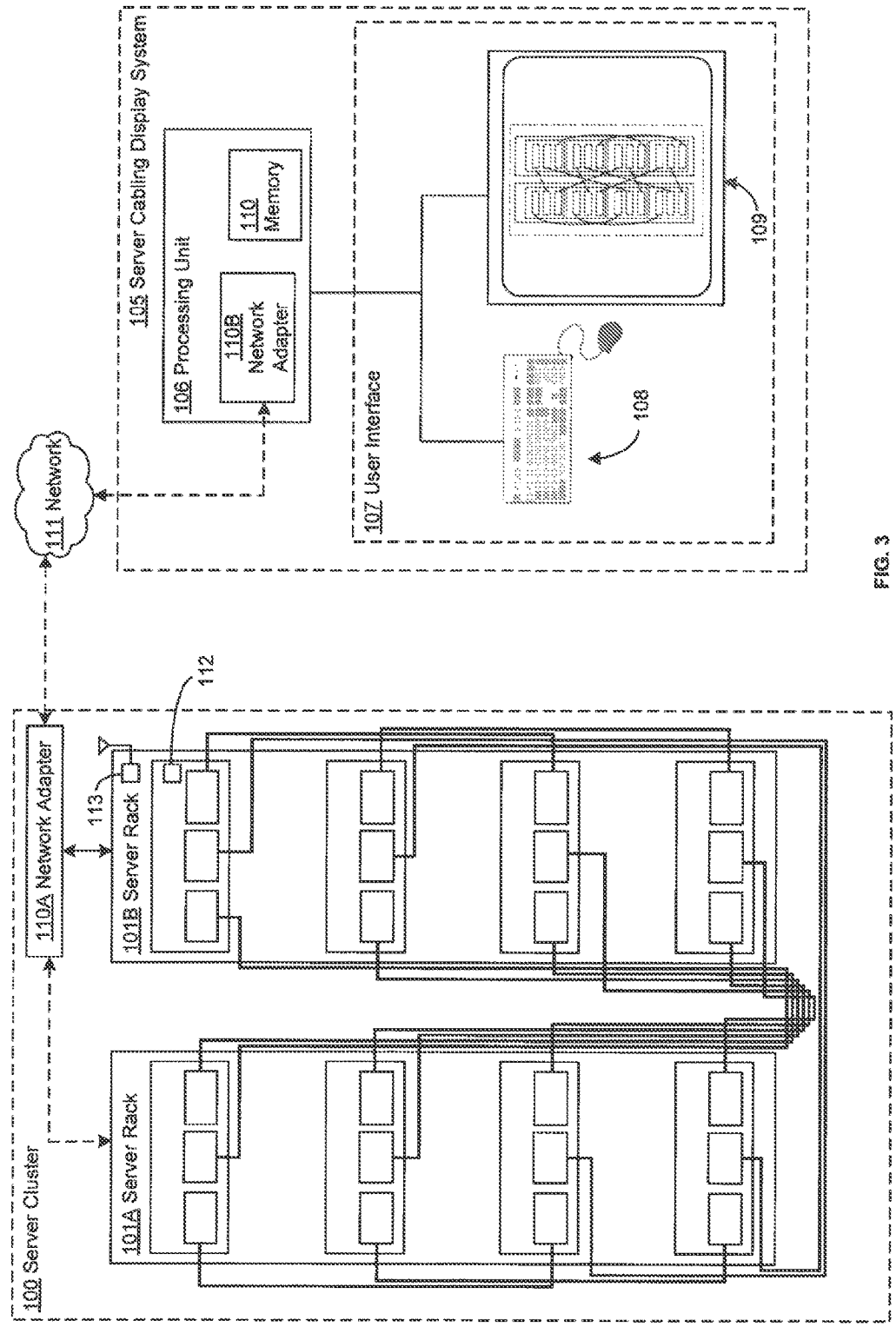

Referring to FIG. 3, to facilitate various service operations associated with the cabling, the server cluster 100 may be operably coupled to a server cabling display system 105. The server cluster 100 may include a network adapter 110A configured to transceive signals via a network 111 (e.g. a local area network, a wide area network, a wireless network, etc.) Similarly, the server cabling display system 105 may include a network adapter 110B for connecting to the network 111. Such connectivity may enable remote viewing of the various cabling display representations associated with the server cluster 100 for monitoring, diagnostics and trouble shooting.

The server cabling display system 105 may provide functionality that facilitates the cabling operations for complex multi-node, multi-rack server systems. The server cabling display system 105 may employ a processing unit 106 configured to process data associated with the cabling of multiple server nodes within multiple server racks. The processing unit 106 may include a microprocessor configured for the execution of computer readable instructions maintained on one or more computer readable storage devices (e.g. hard drive, flash drive, compact disk, DRAM, etc.) The computer readable instructions may direct the microprocessor to carry out one or more operations of the server cabling display system 105, as will be described in further detail below. The processing unit 106 may further include memory 110 for storing graphical representations of the cable routing (as presented in FIG. 1) and the cabling pattern (as presented in FIG. 2).

The server cabling display system 105 may further include a user interface 107 which may receive user requests regarding desired server cabling status parameters as well as provide user feedback regarding those requests. For example, the user interface 107 may include a user input device 108 (e.g. a keyboard, mouse, touch screen, and the like) and display device 109 (e.g. a monitor, touch screen, and the like).

The server cabling display system 105 may be integrated as a component within the server cluster 100 or may be operably coupled to the server cluster 100. The server cabling display system 105 may be implemented in any number of external devices such as dedicated computing devices (e.g. an application specific computing device), general-purpose computing device (e.g. a laptop computer, a desktop computer, etc.) running application specific software, mobile devices (e.g. laptop computers, smart phones, PDAs, etc.), and the like. The coupling may be wired or wireless.

Following is a description of a series of flowcharts depicting implementations. For ease of understanding, the flowcharts are organized such that the initial flowcharts present implementations via an example implementation and thereafter the following flowcharts present alternate implementations and/or expansions of the initial flowchart(s) as either sub-component operations or additional component operations building on one or more earlier-presented flowcharts. Those having skill in the art will appreciate that the style of presentation utilized herein (e.g., beginning with a presentation of a flowchart(s) presenting an example implementation and thereafter providing additions to and/or further details in subsequent flowcharts) generally allows for a rapid and easy understanding of the various process implementations. In addition, those skilled in the art will further appreciate that the style of presentation used herein also lends itself well to modular and/or object-oriented program design paradigms.

Figure 11:
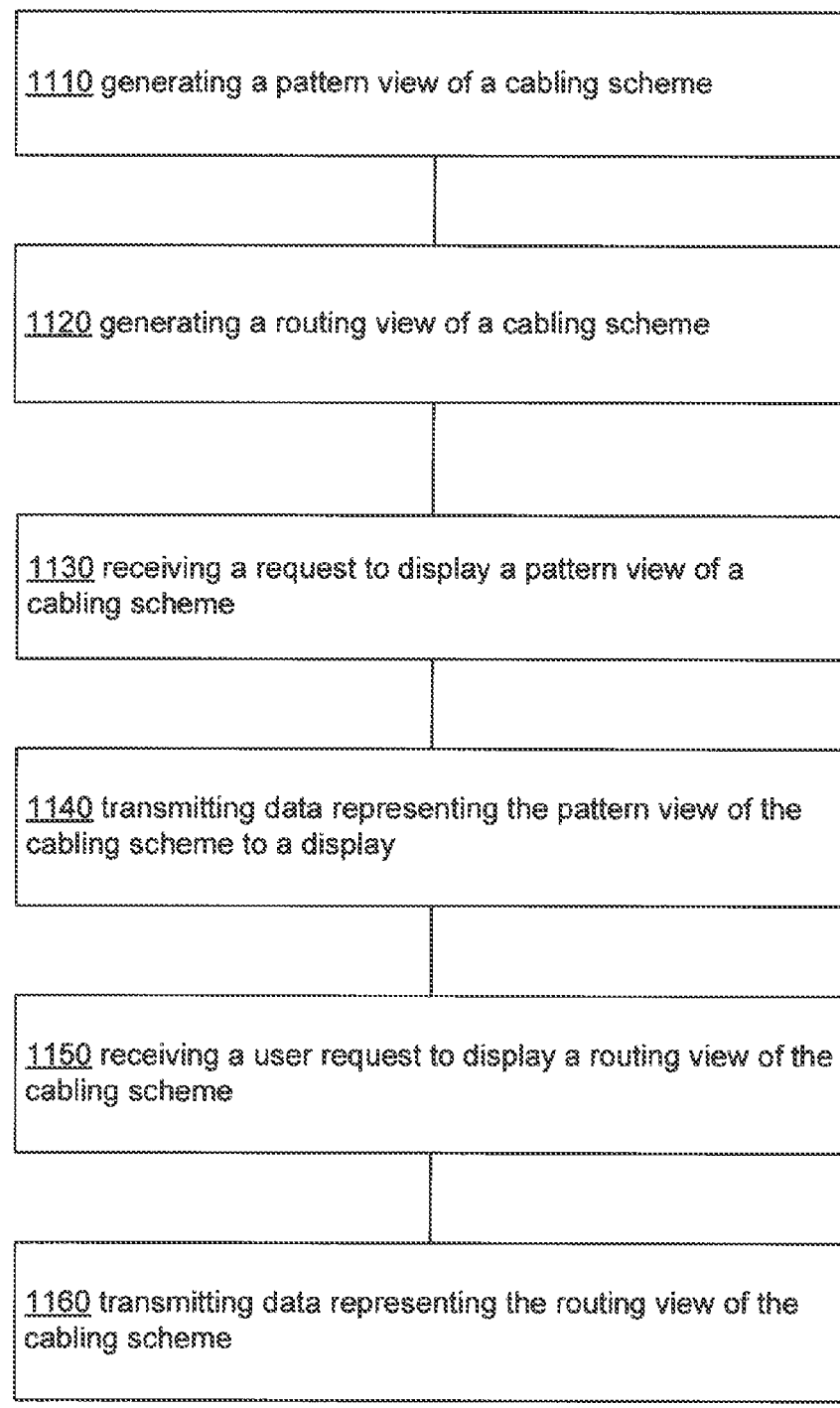

FIG. 11 illustrates an operational flow 1100 representing example operations related to providing server fault notifications. In FIG. 11 and in following figures that include various examples of operational flows, discussion and explanation may be provided with respect to the above-described examples of FIG. 1, and/or with respect to other examples and contexts. However, it should be understood that the operational flows may be executed in a number of other environments and contexts, and/or in modified versions of FIG. 1. In addition, although the various operational flows are presented in the sequence(s) illustrated, it should be understood that the various operations may be performed in other orders than those that are illustrated, or may be performed concurrently.

Operations 1110 and 1120 depict generating a pattern view of a cabling scheme and generating a routing view of a cabling scheme, respectively. The routing view of FIG. 1 and/or the pattern view of FIG. 2 may be generated in a variety of ways.

In one instance, the pattern views and/or the routing views may depict a representation of an intended implementation of the cabling scheme (e.g. views generated without regard to existing cabling errors).

For example, a routing view and/or pattern view associated with a designed cabling scheme may be manually configured by a system designer and hard coded into the server cabling display system 105. The views may represent cabling configurations associated with a particular known server cluster 100 implementation.

In another example, the routing view and/or pattern view associated with a designed cabling scheme may be configured automatically by the server cabling display system 105. The server cabling display system 105 may receive user inputs specifying particular server cluster 100 configuration parameters (e.g. number of nodes, number of racks, distribution of nodes between racks, locations of nodes within racks, etc.) The server cabling display system 105 may search a database containing cabling views associated with server cluster 100 configuration parameter combinations for a cabling view matching the inputted parameters.

In still another example, the server cabling display system 105 may receive data defining particular server cluster 100 configuration parameters (e.g. number of nodes, number of racks, distribution of nodes between racks, locations of nodes within racks, etc.) via node location detection sensors. For example, a passive RFID 112 chip may be attached to each node 102. An RFID sensor 113 may determine the relative positions of each node 102 in a particular rack 101 and provide this information to the server cabling display system 105. Other sensor systems that may be employed to determine the relative locations of nodes 102 include Near-Field Communication (NFC) sensors, and altimeters.

Upon receipt of server cluster 100 configuration parameters, the pattern and/or routing views may be dynamically generated by the server cabling display system 105 based on one or more rules defining inter-nodal mappings for the pattern and/or routing views and those configuration parameters. The server cabling display system 105 may apply a set of rules to the configuration parameters to generate a data set representing the pattern and/or routing views. An exemplary subset of case statements representing such rules may include the following:

Case: total nodes=8;
Case: allNodesAdjacentAndInSameRack;

For the cable connection of node 1 to node 2;
    routing view=cable on right side of the rack AND cable length of 1.0 meters;
        pattern view=direct line connecting the two nodes, with moderate left-skewed arc
For the cable connection of node 1 to node 3;
    routing view=cable on left side of the rack AND cable length of 1.5 meters
        pattern view=direct line connecting the two nodes, with slight right-skewed arc
. . .
case NodesSplitInLowestPositionsOfAdjacentRacks:
. . .

In another instance, the pattern views and/or the routing views may depict an actual detected implementation (e.g. views depicting exiting cabling errors) of a cabling scheme. For example, the server cluster 100 may include a server controller (not shown) configured to monitor the state of each node 102 within the server cluster 100. The server controller may receive signals from each node 102 regarding its connectivity within the server cluster 100. For example, node 102A-1 may inform the server controller of the connections from its port 103A-1, port 103A-2, and port 103A-3 to port 103A-1 of node 102A-4, port 103B-1 of node 102B-1 and port 103B-1 of node 102B-3, respectively. The server controller may maintain a database of these mappings and, when combined with the data regarding the server rack placement of the node 102, the server controller may construct a graphical representation of the various network interconnects.

Such port connection sensing may allow for dynamic updating of the pattern view and/or routing view depending current cabling paths. This dynamic updating of the pattern view and/or routing view may enable the server cabling display system 105 to provide directed user assistance regarding proper cable connection. For example, the server cabling display system 105 may provide audio and/or visual assistance (e.g. " . . . now take the other end of the 4 meter yellow cable and connect it to port y on node x . . . ").

As ports are progressively connected in a cabling task, the server cabling display system 105 may dynamically update the pattern view and/or the routing view to correspond to the current cabling scheme, compare that cabling scheme to a predetermined intended cabling scheme and provide user assistance in correlating the current cabling scheme with the intended cabling scheme.

Figure 4:
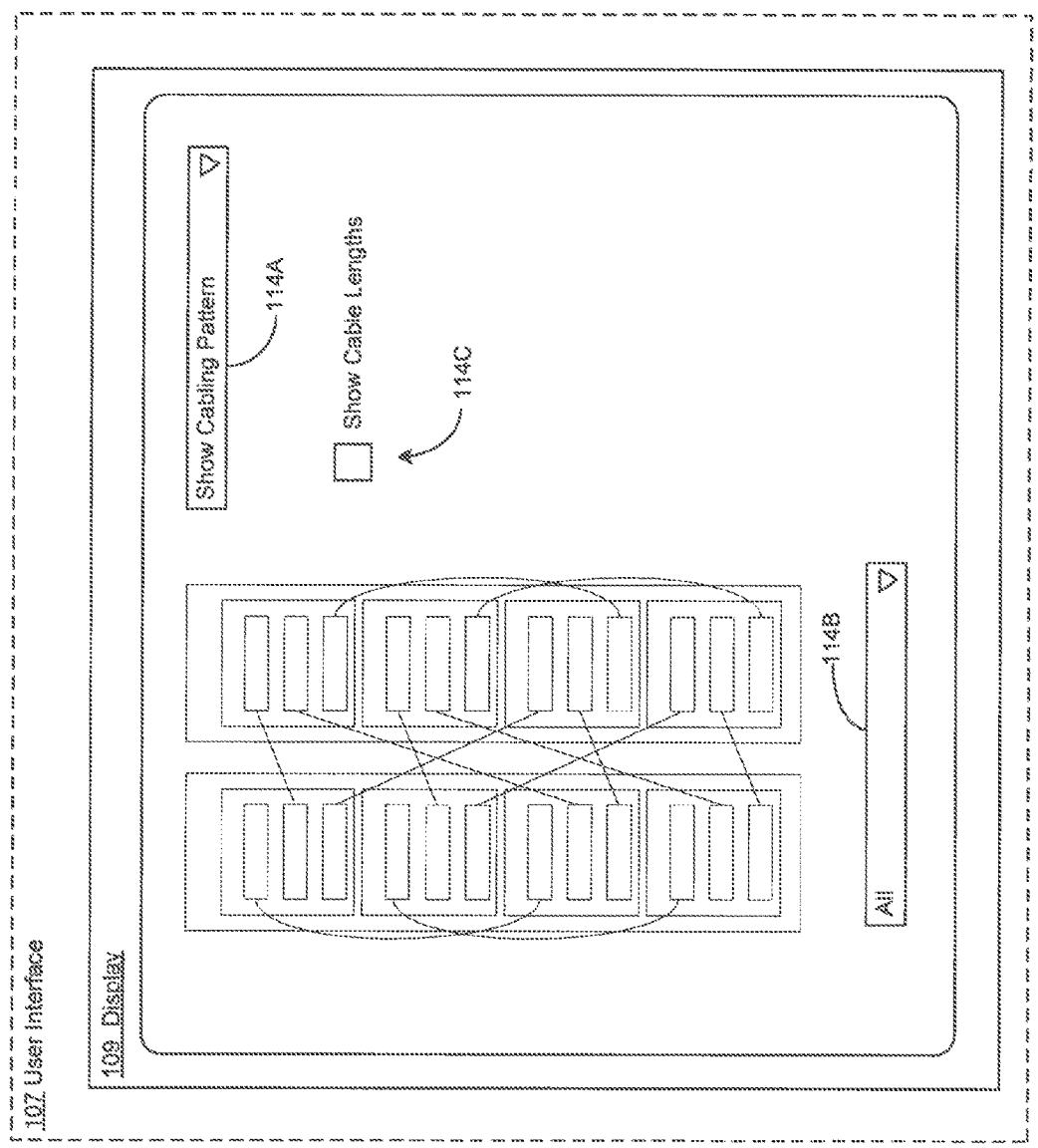

Operation 1130 depicts receiving a request to display a pattern view of a cabling scheme. For example, as shown in FIGS. 3 and 4, a user may employ user input device 108 to make a request (e.g. selecting a "Show Cabling Pattern" option from a drop-down menu 114A). The processing unit 106 may receive the user input request and initiate processing according to that request.

Operation 1140 depicts transmitting data representing the pattern view of the cabling scheme to a display device. For example, as shown in FIGS. 3 and 4, the processing unit 106 may access data representing the graphical view of the cabling pattern maintained in memory 110. The processing unit 106 may then transmit this data to the display device 109 of the user interface 107. The display device 109 may then display the pattern view of the cabling scheme, which shows a repeating "stitching" pattern, making it easy for the user to understand the cabling at a high level.

Figure 5:
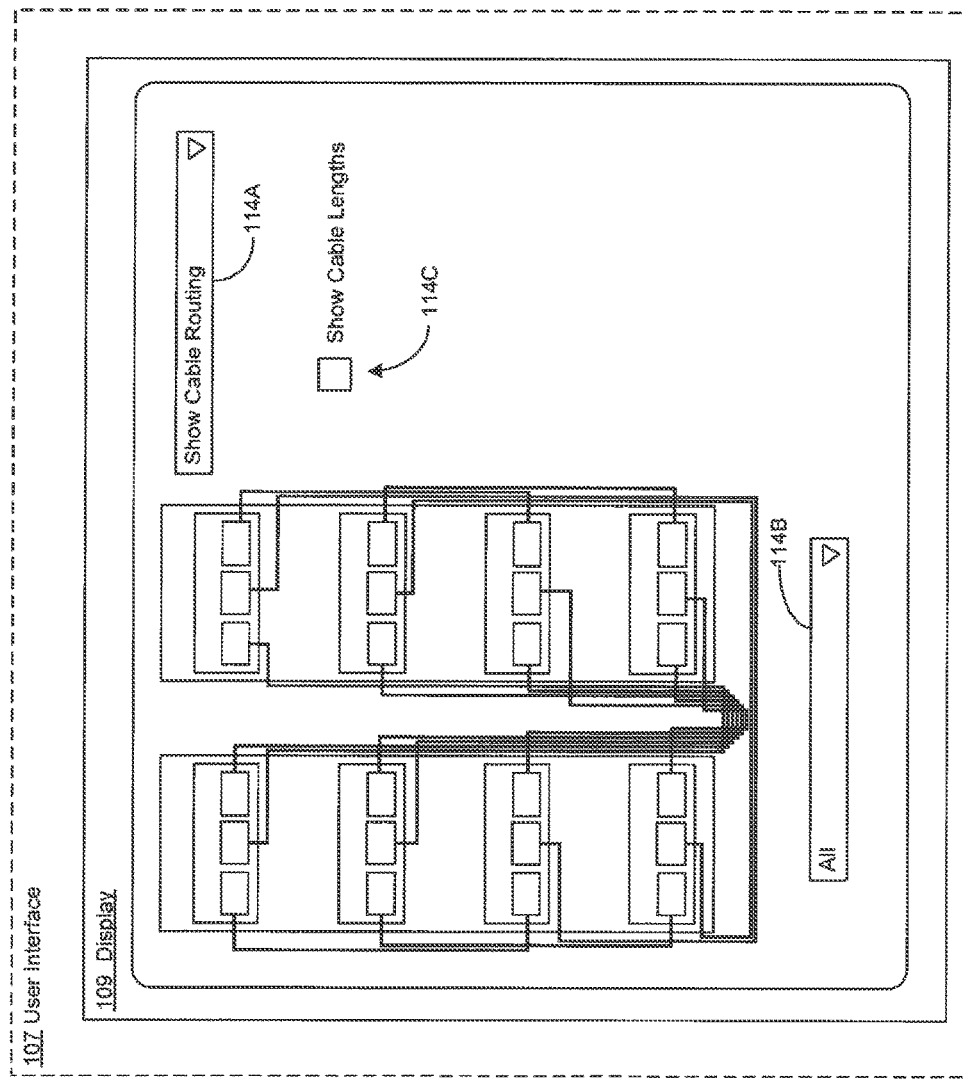

Operation 1150 depicts receiving a request to display a routing view of the cabling scheme. For example, as shown in FIGS. 3 and 5, a user may employ user input device 108 to make a request (e.g. selecting a "Show Cable Routing" option from a drop-down menu 114A). The processing unit 106 may receive the user input request and initiate processing according to that request.

Operation 1160 depicts transmitting data representing the routing view of the cabling scheme to the display device. For example, as shown in FIGS. 3 and 5, the processing unit 106 may access data representing the graphical view of the cable routing maintained in memory 110. The processing unit 106 may then transmit this data to the display device 109 of the user interface 107. The display device 109 may then display the cable routing view of the cabling scheme with reference to various physical environmental features of the server cluster 100, which makes it easy for the user to see how the actual physical cables should be routed between the nodes.

Figure 12:
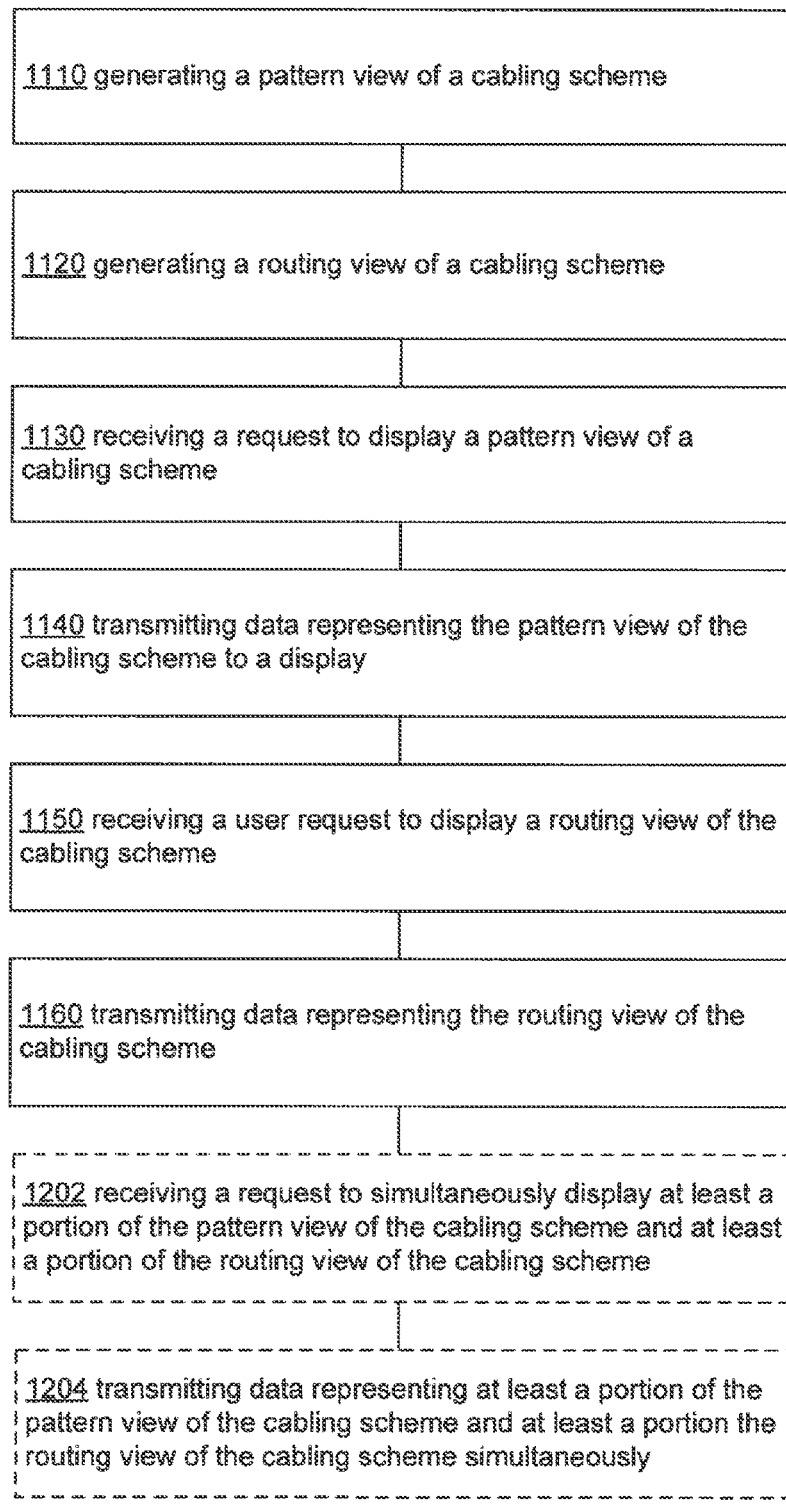

FIG. 12 illustrates alternative embodiments of the example operational flow 1100 of FIG. 11. FIG. 12 illustrates example embodiments where the operational flow 1100 may include at least one additional operation. Additional operations may include an operation 1202 and/or an operation 1204.

Figure 6:
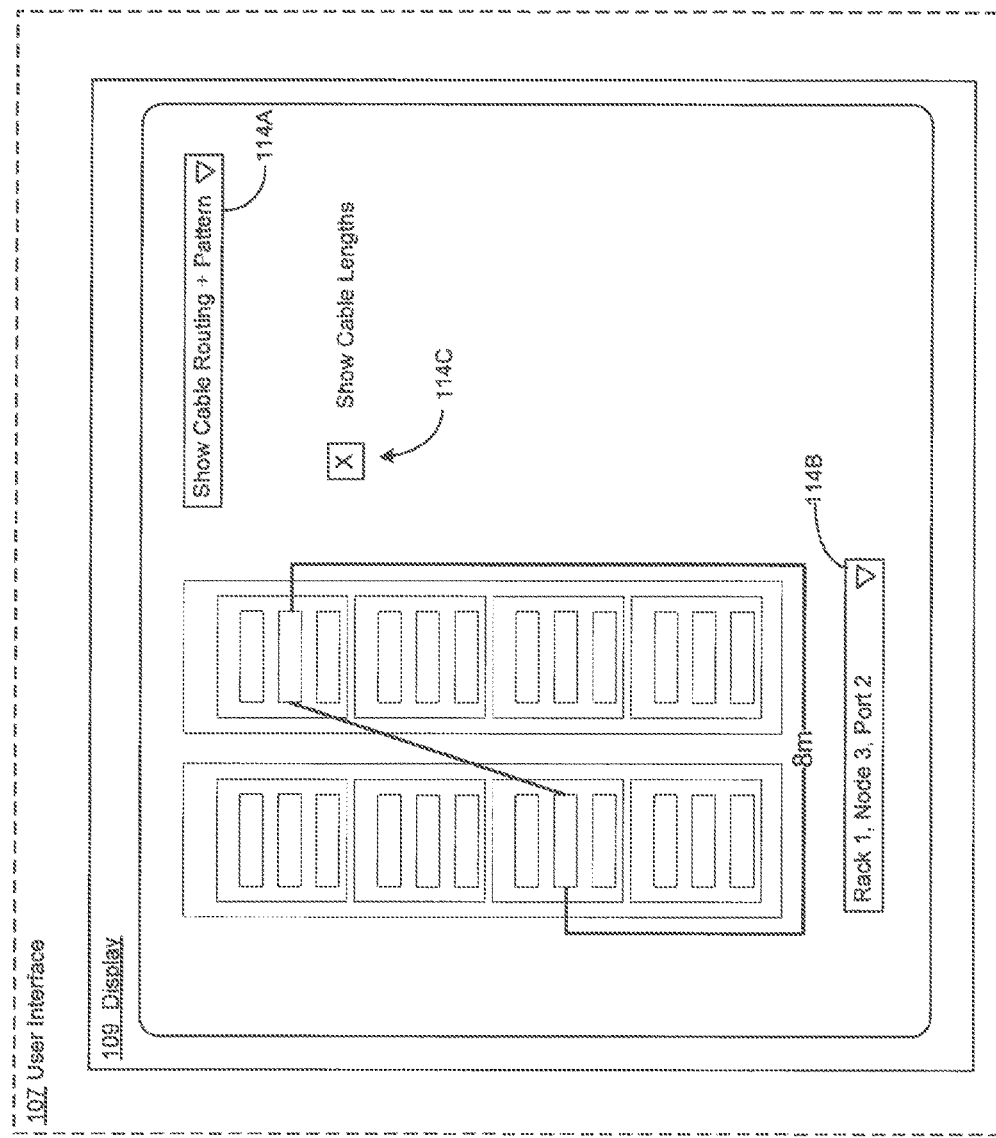

Operation 1202 depicts receiving a request to simultaneously display at least a portion of the pattern view of the cabling scheme and at least a portion of the routing view of the cabling scheme. For example, as shown in FIGS. 3 and 6, a user may employ user input device 108 to make a request (e.g. selecting a "Show Cable Routing+Pattern" option from a drop-down menu 114A). The processing unit 106 may receive the user input request and initiate processing according to that request.

Operation 1204 depicts transmitting data representing at least a portion of the pattern view of the cabling scheme and at least a portion the routing view of the cabling scheme simultaneously to the display device. For example, as shown in FIGS. 3 and 6, the processing unit 106 may access data representing the graphical view of the cable routing and the graphical view of the cabling pattern maintained in memory 110. The processing unit 106 may then transmit this data to the display device 109 of the user interface 107. The display device 109 may then display the cable routing view and the cabling pattern view of the cabling scheme.

Figure 13:
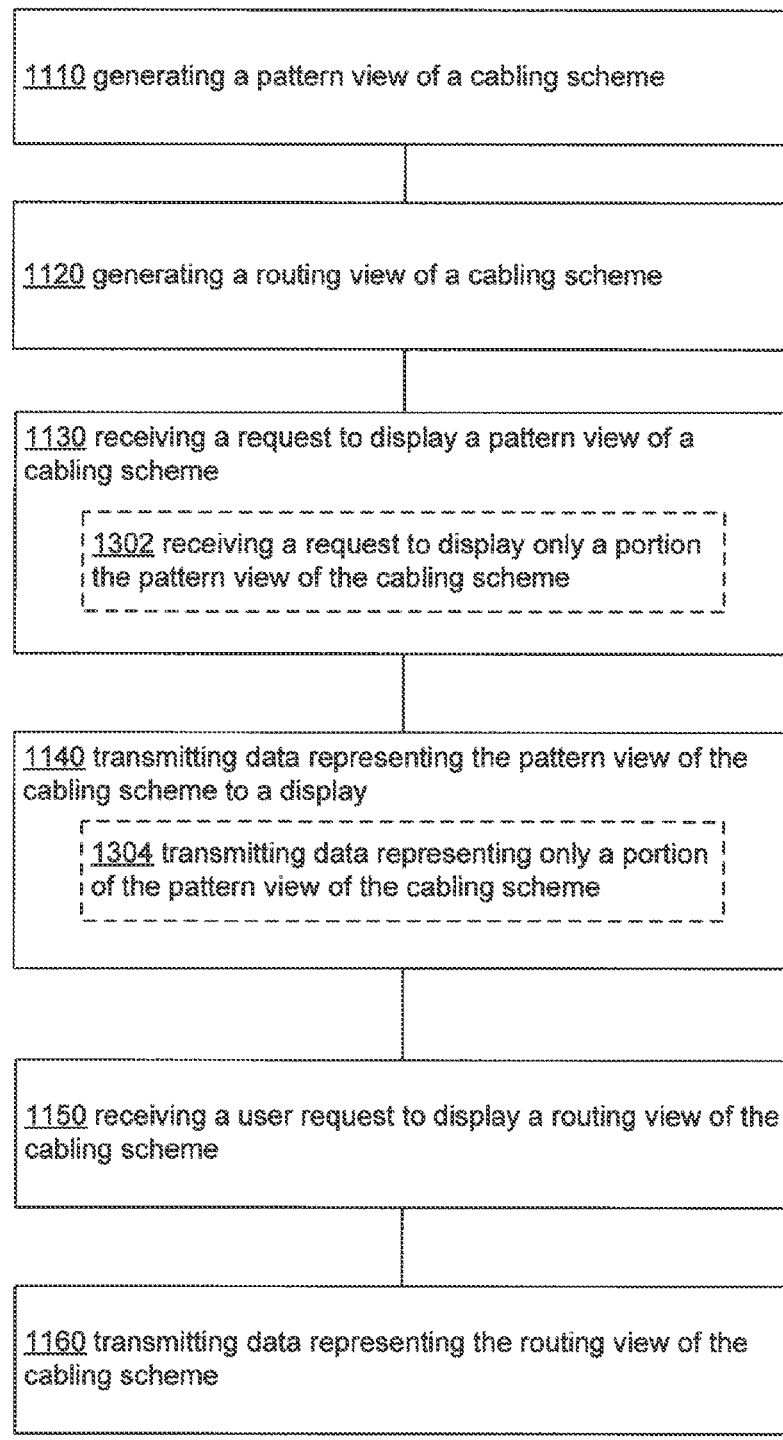

FIG. 13 illustrates alternative embodiments of the example operational flow 1100 of FIG. 11. FIG. 13 illustrates example embodiments where operations 1110 and 1120 may include at least one additional operation. Additional operations may include an operation 1302 and/or an operation 1304, respectively.

Figure 7:
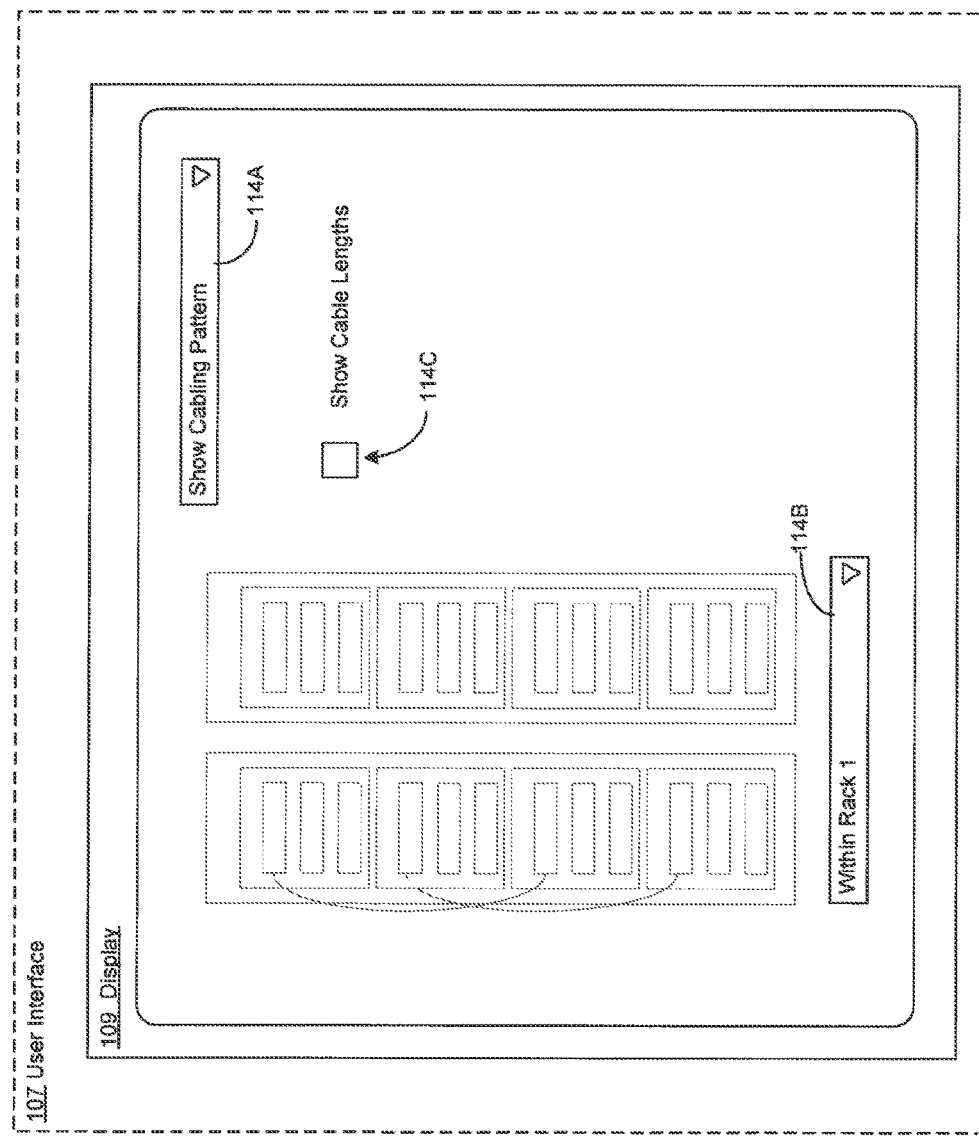
Figure 8:
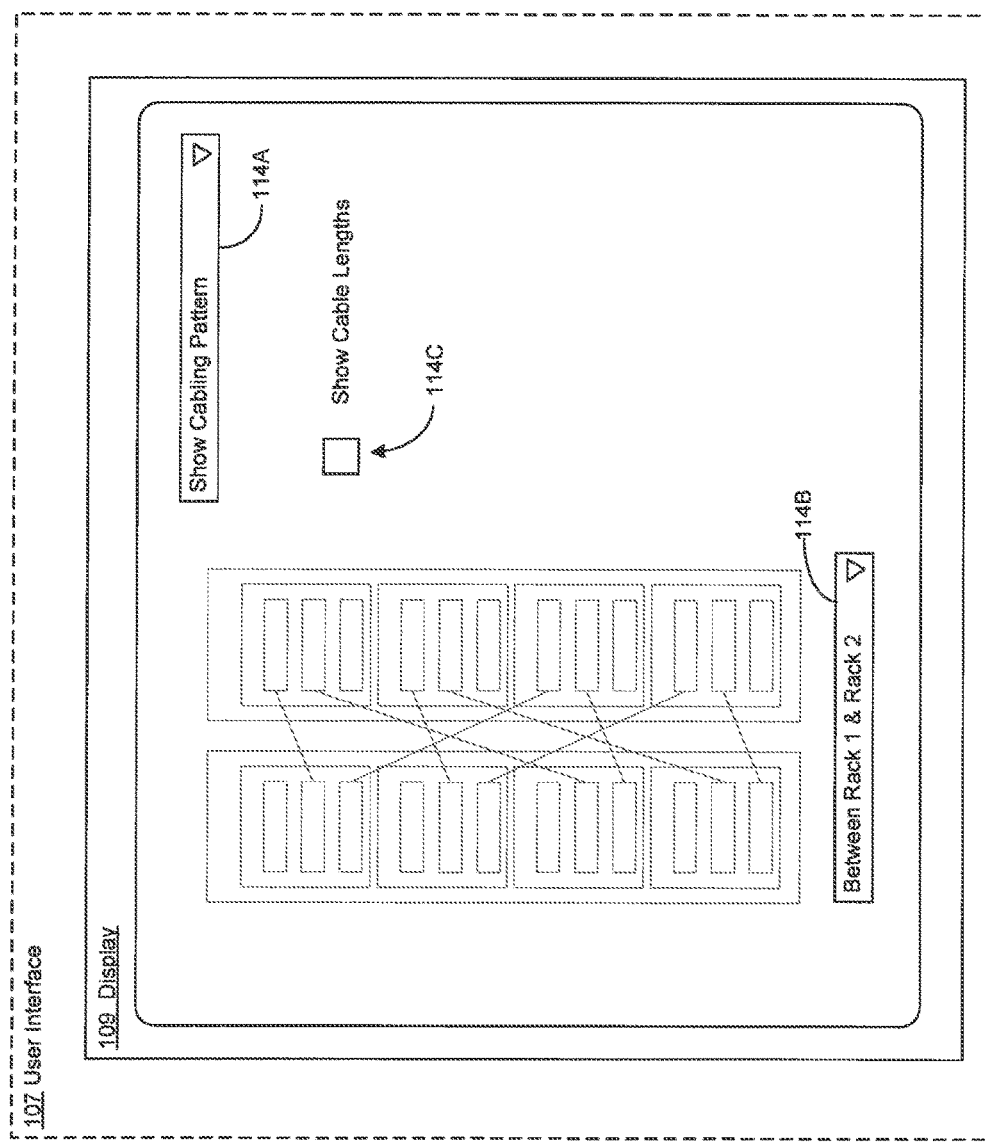

Operation 1302 depicts receiving a request to display only a portion the pattern view of the cabling scheme. For example, as shown in FIGS. 3 and 7-8, a user may employ user input device 108 to make a request to view the cabling pattern (e.g. selecting a "Show Cabling Pattern" option from a drop-down menu 114A). The processing unit 106 may receive the user input request and initiate processing according to that request. Further, the user may select a portion of the cabling pattern to view (e.g. selecting a view of the cabling pattern "Within Rack 1" as shown in FIG. 7; selecting a view of the cabling pattern "Between Rack 1 & Rack 2" as shown in FIG. 8).

Operation 1304 depicts transmitting data representing only a portion of the pattern view of the cabling scheme to the display device. For example, the processing unit 106 may access data representing only those selected portions of the graphical view of the graphical view of the cabling pattern maintained in memory 110. The processing unit 106 may then transmit this data to the display device 109 of the user interface 107. The display device 109 may then display the selected portions of the cabling pattern view of the cabling scheme.

Figure 14:
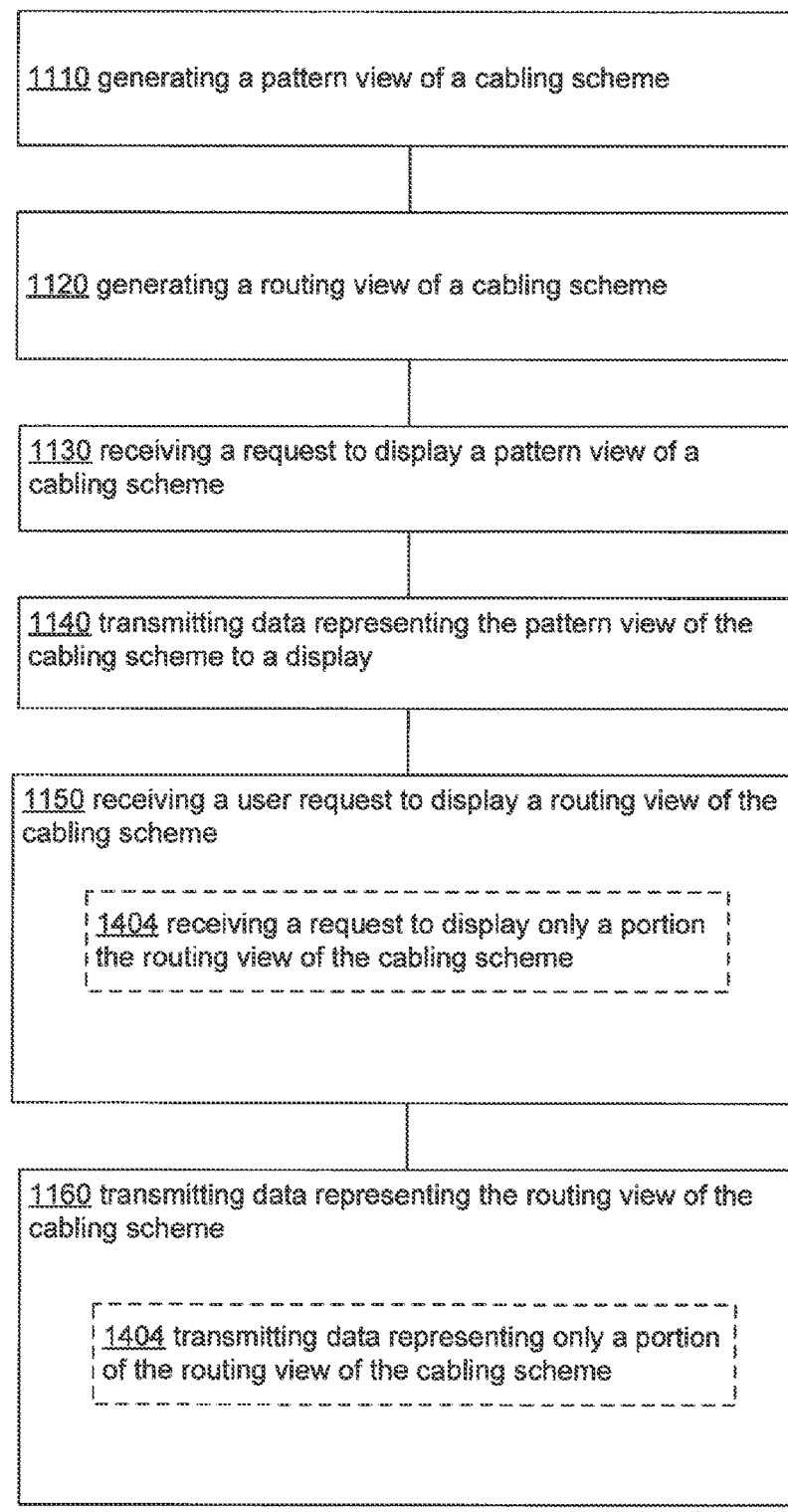

FIG. 14 illustrates alternative embodiments of the example operational flow 1100 of FIG. 11. FIG. 14 illustrates example embodiments where operations 1130 and 1140 and may include at least one additional operation. Additional operations may include an operation 1402 and/or 1404, respectively.

Figure 9:
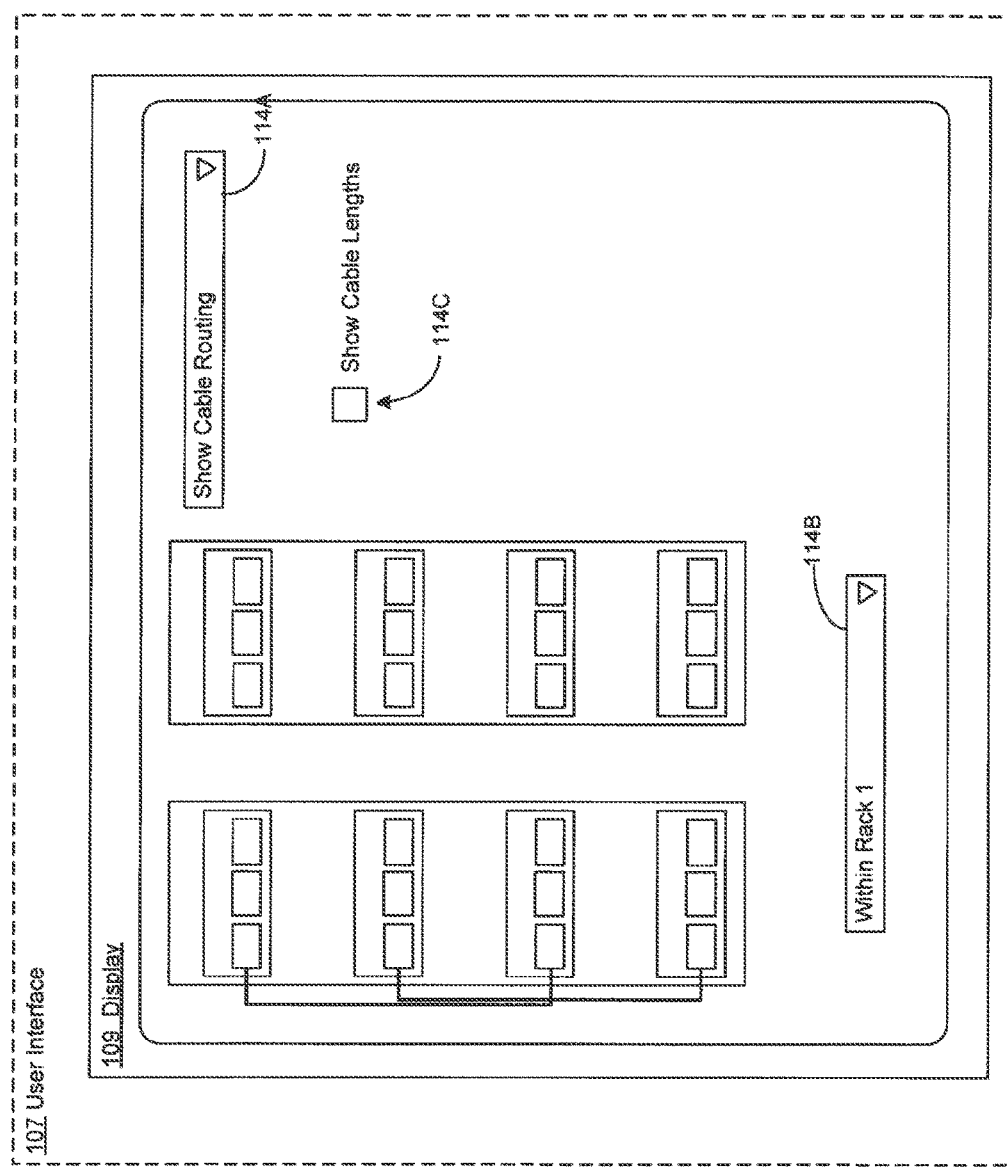
Figure 10:
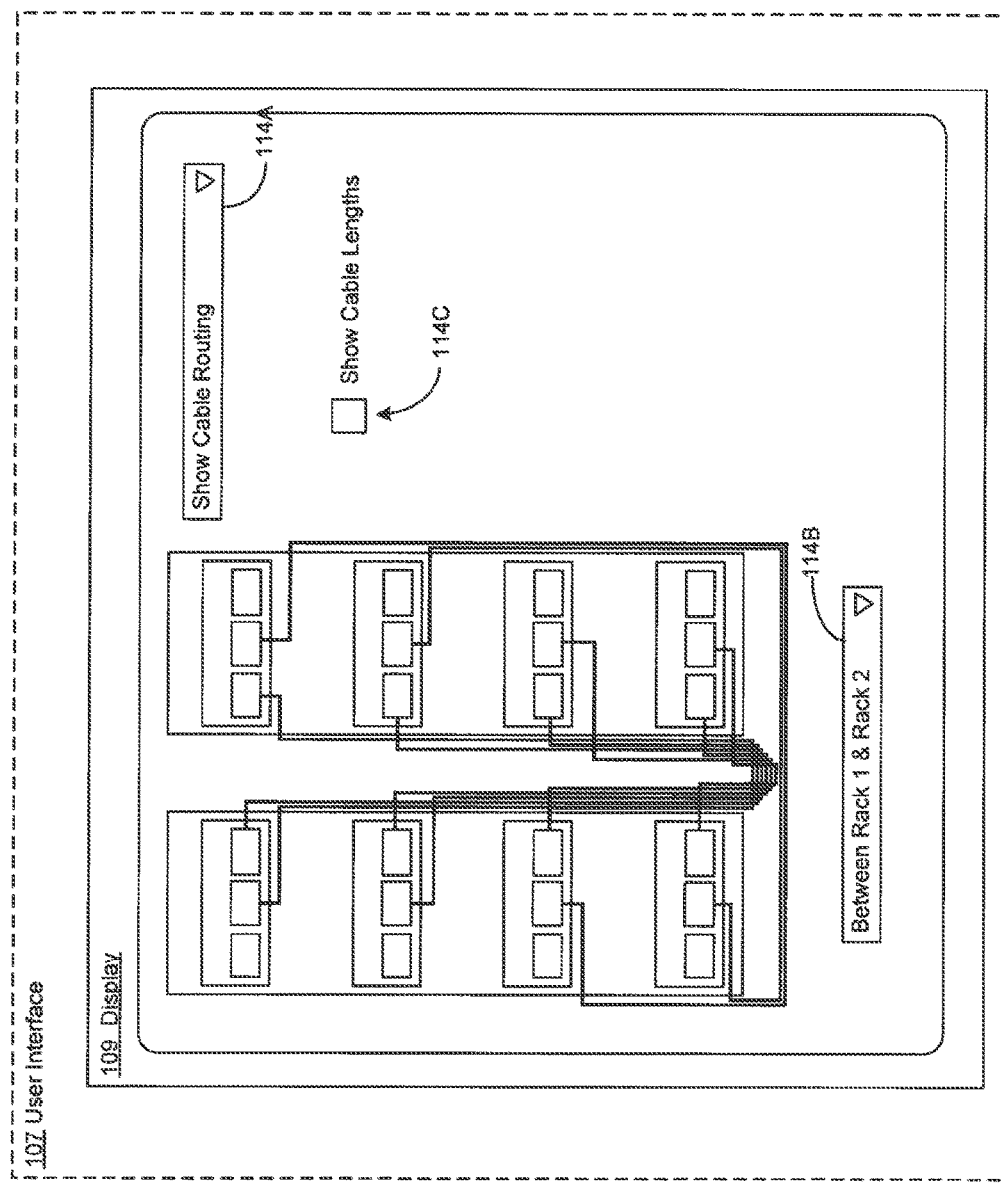

Operation 1402 depicts receiving a request to display only a portion of the routing view of the cabling scheme. For example, as shown in FIGS. 3 and 9-10, a user may employ user input device 108 to make a request to view the cable routing (e.g. selecting a "Show Cable Routing" option from a drop-down menu 114A). The processing unit 106 may receive the user input request and initiate processing according to that request. Further, the user may select a portion of the cable routing to view (e.g. selecting a view of the cable routing "Within Rack 1" as shown in FIG. 9; selecting a view of the cable routing "Between Rack 1 & Rack 2" as shown in FIG. 10).

Operation 1404 depicts transmitting data representing only a portion of the routing view of the cabling scheme to the display device. For example, the processing unit 106 may access data representing only those selected portions of the graphical view of the graphical view of the cabling pattern maintained in memory 110. The processing unit 106 may then transmit this data to the display device 109 of the user interface 107. The display device 109 may then display the selected portions of the cabling pattern view of the cabling scheme.

Figure 15:
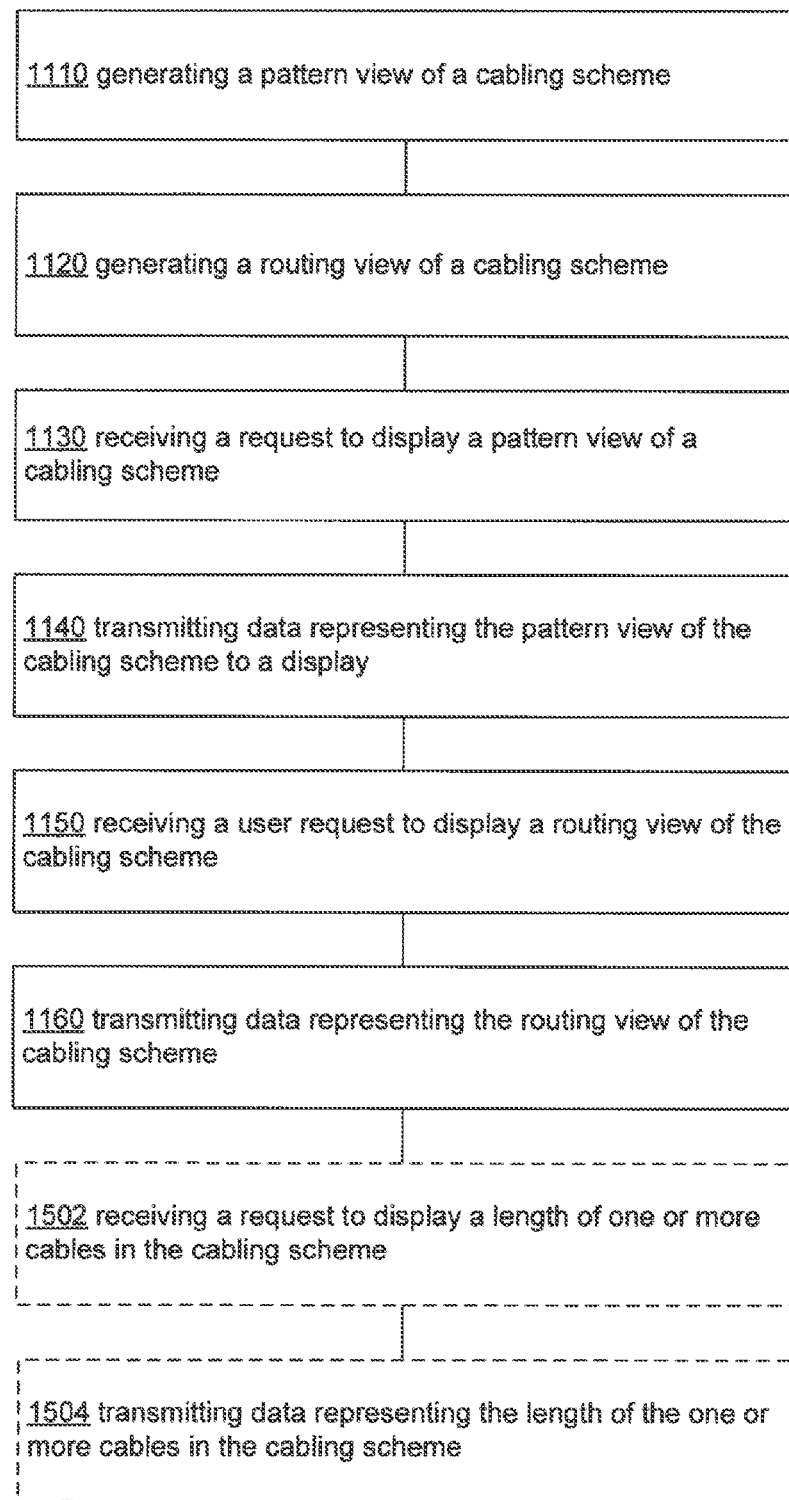

FIG. 15 illustrates alternative embodiments of the example operational flow 1100 of FIG. 11. FIG. 15 illustrates example embodiments where the operational flow 1100 may include at least one additional operation. Additional operations may include an operation 1502 and/or an operation 1504.

Operation 1502 depicts receiving a request to display a length of one or more cables in the cabling scheme. For example, as shown in FIG. 6, a user may employ user input device 108 to make a request (e.g. selecting a "Show Cable Length" option from a drop-down menu 114C). The processing unit 106 may receive the user input request and initiate processing according to that request.

Operation 1504 depicts transmitting data representing the length of the one or more cables in the cabling scheme to the display device. For example, as shown in FIG. 6, the processing unit 106 may access data representing the graphical view of the cable routing and the associated cable lengths for the interconnects maintained in memory 110. The processing unit 106 may then transmit this data to the display device 109 of the user interface 107. The display device 109 may then display the cable routing view of the cabling scheme including the length of one or more cables.

It should be noted that those having skill in the art will recognize that the state of the art has progressed to the point where there is little distinction left between hardware, software, and/or firmware implementations of aspects of systems; the use of hardware, software, and/or firmware is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

In some implementations described herein, logic and similar implementations may include software or other control structures. Electronic circuitry, for example, may have one or more paths of electrical current constructed and arranged to implement various functions as described herein. In some implementations, one or more media may be configured to bear a device-detectable implementation when such media hold or transmit device detectable instructions operable to perform as described herein. In some variants, for example, implementations may include an update or modification of existing software or firmware, or of gate arrays or programmable hardware, such as by performing a reception of or a transmission of one or more instructions in relation to one or more operations described herein. Alternatively or additionally, in some variants, an implementation may include special-purpose hardware, software, firmware components, and/or general-purpose components executing or otherwise invoking special-purpose components. Specifications or other implementations may be transmitted by one or more instances of tangible transmission media as described herein, optionally by packet transmission or otherwise by passing through distributed media at various times.

Alternatively or additionally, implementations may include executing a special-purpose instruction sequence or invoking circuitry for enabling, triggering, coordinating, requesting, or otherwise causing one or more occurrences of virtually any functional operations described herein. In some variants, operational or other logical descriptions herein may be expressed as source code and compiled or otherwise invoked as an executable instruction sequence. In some contexts, for example, implementations may be provided, in whole or in part, by source code, such as C++, or other code sequences. In other implementations, source or other code implementation, using commercially available and/or techniques in the art, may be compiled/implemented/translated/converted into high-level descriptor languages (e.g., initially implementing described technologies in C or C++ programming language and thereafter converting the programming language implementation into a logic-synthesizable language implementation, a hardware description language implementation, a hardware design simulation implementation, and/or other such similar mode(s) of expression). For example, some or all of a logical expression (e.g., computer programming language implementation) may be manifested as a Verilog-type hardware description (e.g., via Hardware Description Language (HDL) and/or Very High Speed Integrated Circuit Hardware Descriptor Language (VHDL)) or other circuitry model which may then be used to create a physical implementation having hardware (e.g., an Application Specific Integrated Circuit). Those skilled in the art will recognize how to obtain, configure, and optimize suitable transmission or computational elements, material supplies, actuators, or other structures in light of these teachings.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, a solid state storage device (e.g. a USB drive), etc.; and a transmission type medium such as a digital and/or an analog communication medium (e.g., a fiber optic cable, a waveguide, a wired communications link, a wireless communication link (e.g., transmitter, transceiver, transmission logic, reception logic, etc.).

In a general sense, those skilled in the art will recognize that the various aspects described herein which can be implemented, individually and/or collectively, by a wide range of hardware, software, firmware, and/or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of memory (e.g., random access, flash, read only, etc.)), and/or electrical circuitry forming a communications device (e.g., a modem, communications switch, optical-electrical equipment, etc.). Those having skill in the art will recognize that the subject matter described herein may be implemented in an analog or digital fashion or some combination thereof.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components, and/or wirelessly interactable, and/or wirelessly interacting components, and/or logically interacting, and/or logically interactable components.

In some instances, one or more components may be referred to herein as "configured to," "configured by," "configurable to," "operable/operative to," "adapted/adaptable," "able to," "conformable/conformed to," etc. Those skilled in the art will recognize that such terms (e.g. "configured to") can generally encompass active-state components and/or inactive-state components and/or standby-state components, unless context requires otherwise.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms. For example, the phrase "A or B" will be typically understood to include the possibilities of "A" or "B" or "A and B."

With respect to the appended claims, those skilled in the art will appreciate that recited operations therein may generally be performed in any order. In addition, although various operational flows are presented in a sequence(s), it should be understood that the various operations may be performed in other orders than those that are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to" or other past-tense adjectives are generally not intended to exclude such variants, unless context dictates otherwise.

Although specific dependencies have been identified in the claims, it is to be noted that all possible combinations of the features of the claims are envisaged in the present application, and therefore the claims are to be interpreted to include all possible multiple dependencies. It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

Further, all of the above U.S. patents, U.S. patent application publications, U.S. patent applications, foreign patents, foreign patent applications and non-patent publications referred to in this specification and/or listed in any Application Data Sheet, are incorporated herein by reference, to the extent not inconsistent herewith.

What is claimed is:

1. A method for server cabling display comprising:
    generating a pattern view of a cabling scheme including one or more direct interconnects abstractly representing one or more actual cabling paths of a cabling environment;
    generating a routing view of the cabling scheme indicative of the one or more actual cabling paths relative to one or more physical structural features of the cabling environment;
    receiving a request to display the pattern view of the cabling scheme;
    transmitting data representing the pattern view of the cabling scheme to a display device;
    receiving a request to display the routing view of the cabling scheme;
    transmitting data representing the routing view of the cabling scheme to the display device;
    receiving a request to simultaneously display at least a portion of the pattern view and at least a portion of the routing view of the cabling scheme;
    transmitting data representing the at least a portion of the pattern view and the at least a portion the routing view of the cabling scheme to the display device, wherein transmitting data comprises accessing in memory data representing only a selected portion, the selected portion including at least one of: (i) the pattern view, (ii) the routing view, and (iii) the at least a portion of the pattern view and the at least a portion of the routing view of the cabling scheme; and
    displaying the selected portion, wherein the pattern view and the routing view are selectably displayed simultaneously in a single graphical representation of the pattern view and the routing view.

2. The method of claim 1, wherein the generating a pattern view of a cabling scheme including one or more direct interconnects abstractly representing one or more actual cabling paths of a cabling environment comprises:
    generating data representing a graphical view of at least one direct interconnect between at least a first server node and a second server node.

3. The method of claim 2, wherein the generating data representing a graphical view of at least one direct interconnect between at least a first server node and a second server node comprises:
    receiving one or more server cluster configuration parameters defining one or more physical configurations of the first server node and the second server node;
    mapping the at least one direct interconnect between the first server node and the second server node according to the server cluster configuration parameters and one or more mapping rules; and
    storing data representing a graphical view of the at least one direct interconnect overlaid with a graphical view of at least a portion of a server cluster.

4. The method of claim 3, wherein the generating a routing view of the cabling scheme indicative of the one or more actual cabling paths relative to one or more physical structural features of the cabling environment comprises:
    generating data representing a graphical view of at least one interconnect approximating an actual physical routing of a cable with respect to physical server node environment features between the first server node and the second server node.

5. The method of claim 4, wherein the generating data representing a graphical view of at least one interconnect approximating an actual physical routing of a cable with respect to physical server node environment features between the first server node and the second server node comprises:
   receiving one or more server cluster configuration parameters defining one or more physical configurations of the first server node and the second server node;
   mapping the at least one interconnect approximating an actual physical routing of a cable with respect to physical server node environment features between the first server node and the second server node according to the server cluster configuration parameters and one or more mapping rules; and
   storing data representing a graphical view of the at least one interconnect approximating an actual physical routing of a cable with respect to physical server node environment features between the first server node and the second server node overlaid with a graphical view of at least a portion of a server cluster.

6. The method of claim 1, wherein the at least a portion of the pattern view and the at least a portion of the routing view are displayed simultaneously in the single graphical representation and are differentiated respectively from an entire pattern view or an entire routing view based on a node or a rack selected for interconnect display.

7. The method of claim 1, wherein the receiving a request to display the pattern view of the cabling scheme further comprises:
   receiving a request to display only a portion of the pattern view of the cabling scheme, wherein the requested portion is differentiated from an entire pattern view based on a node or a rack selected for interconnect display.

8. The method of claim 7, wherein the receiving a request to display only a portion of the pattern view of the cabling scheme comprises:
   receiving a request to display only the pattern view of the cabling scheme within a single server rack.

9. The method of claim 7, wherein the receiving a request to display only a portion of the pattern view of the cabling scheme comprises:
   receiving a request to display only the pattern view of the cabling scheme between a first server rack and a second server rack.

10. The method of claim 7, wherein the transmitting data representing the pattern view of the cabling scheme to a display device comprises:
    transmitting data representing only a portion of the pattern view of the cabling scheme to the display device.

11. The method of claim 1, wherein the receiving a request to display the routing view of the cabling scheme comprises:
    receiving a request to display only a portion of the routing view of the cabling scheme.

12. The method of claim 11, wherein the receiving a request to display only a portion of the routing view of the cabling scheme comprises:
    receiving a request to display only a portion of the routing view of the cabling scheme within a single server rack.

13. The method of claim 11, wherein the receiving a request to display only a portion of the routing view of the cabling scheme comprises:
    receiving a request to display only portions of the routing view of the cabling scheme connecting a first server rack and a second server rack.

14. The method of claim 11, wherein the receiving a request to display only a portion of the routing view of the cabling scheme comprises:
    receiving a request to display only a portion of the routing view of the cabling scheme for a single cable.

15. The method of claim 11, wherein the transmitting data representing the routing view of the cabling scheme to a display device comprises:
    transmitting data representing only a portion of the routing view of the cabling scheme to the display device.

16. The method of claim 1; further comprising:
    receiving a request to display a length of one or more cables in the cabling scheme; and
    transmitting data representing the length of the one or more cables in the cabling scheme to the display device.

17. A system for server cabling display comprising:
    a computing device;
    a user input device operably coupled to the computing device;
    a display device operably coupled to the computing device,
    wherein the computing device is configured for:
      receiving a request to display a pattern view of the cabling scheme including one or more direct interconnects abstractly representing one or more actual cabling paths of a cabling environment from the user input device;
      transmitting data representing the pattern view of the cabling scheme to the display device;
      receiving a request to display a routing view of the cabling scheme indicative of the one or more actual cabling paths relative to one or more physical structural features of the cabling environment from the user input device;
      transmitting data representing the routing view of the cabling scheme to the display device;
      receiving a request to simultaneously display at least a portion of the pattern view and at least a portion of the routing view of the cabling scheme;
      transmitting data representing the at least a portion of the pattern view and the at least a portion the routing view of the cabling scheme to the display device, wherein transmitting data comprises accessing in memory data representing only a selected portion, the selected portion including at least one of: (i) the pattern view, (ii) the routing view, and (iii) the at least a portion of the pattern view and the at least a portion of the routing view of the cabling scheme; and
      displaying the selected portion, wherein the pattern view and the routing view are selectably displayed simultaneously in a single graphical representation of the pattern view and the routing view.

18. The system of claim 17, wherein the receiving a request to display a pattern view of the cabling scheme including one or more direct interconnects abstractly representing one or more actual cabling paths of a cabling environment from the user input device further comprises:
    generating data representing a graphical view of at least one direct interconnect between at least a first server node and a second server node.

19. The system of claim 18, wherein the generating data representing a graphical view of at least one direct interconnect between at least a First server node and a second server node further comprises:

receiving one or more server cluster configuration parameters defining one or more physical configurations of the first server node and the second server node;

mapping the at least one direct interconnect between the first server node and the second server node according to the server cluster configuration parameters and one or more mapping rules; and storing data representing a graphical view of the at least one direct interconnect overlaid with a graphical view of at least a portion of a server cluster.

20. The system of claim 17, wherein the generating a routing view of the cabling scheme indicative of the one or more actual cabling paths relative to one or more physical structural features of the cabling environment further comprises:

generating data representing a graphical view of at least one interconnect approximating an actual physical routing or a cable with respect to physical server node environment features between the first server node and the second server node.

21. The system of claim 20, wherein the generating data representing a graphical view of at least one interconnect approximating an actual physical routing of a cable with respect to physical server node environment features between the first server node and the second server node further comprises:

receiving one or more server cluster configuration parameters defining one or more physical configurations of the first server node and the second server node;

mapping the at least one interconnect approximating an actual physical routing of a cable with respect to physical server node environment features between the first server node and the second server node according to the server cluster configuration parameters and one or more mapping rules; and storing data representing a graphical view of the at least one interconnect approximating an actual physical routing of a cable with respect to physical server node environment features between the first server node and the second server node overlaid with a graphical view of at least a portion of a server cluster.

22. The system of claim 17, wherein the computing device is further configured for:

displaying the at least a portion of the pattern view and the at least a portion of the routing view simultaneously in the single graphical representation with the at least a portion of the pattern view and the at least a portion of the routing view being differentiated respectively from an entire pattern view or an entire routing view based on a node or a rack selected for interconnect display.

23. The system of claim 17, wherein the receiving a request to display the pattern view of the cabling scheme further comprises:

receiving a request to display only a portion of the pattern view of the cabling scheme.

24. The system of claim 23, wherein the receiving a request to display only a portion or the pattern view of the cabling scheme comprises:

receiving a request to display only the pattern view of the cabling scheme within a single server rack.

25. The system of claim 23, wherein the receiving a request to display only a portion of the pattern view of the cabling scheme comprises:

receiving a request to display only the pattern view of the cabling scheme between a first server rack and a second server rack.

26. The system of claim 23, wherein the transmitting data representing the pattern view of the cabling scheme to the display device comprises:

transmitting data representing only a portion of the pattern view of the cabling scheme to the display device.

27. The system of claim 17, wherein the receiving a request to display the routing view of the cabling scheme comprises:

receiving a request to display only a portion of the routing view of the cabling scheme, wherein the requested portion is differentiated from an entire routing view based on a node or a rack selected for interconnect display.

28. The system of claim 27, wherein the receiving a request to display only a portion of the routing view of the cabling scheme comprises;

receiving a request to display only a portion of the routing view of the cabling scheme within a single server rack.

29. The system of claim 27, wherein the receiving a request to display only a portion of the routing view of the cabling scheme comprises:

receiving a request to display only portions of the routing view of the cabling scheme connecting a first server rack and a second server rack.

30. The system of claim 27, wherein the receiving a request to display only a portion of the routing view of the cabling scheme comprises:

receiving a request to display only a portion of the routing view of the cabling scheme for a single cable.

31. The system of claim 27, wherein the transmitting data representing the routing view of the cabling scheme to the display device comprises:

transmitting data representing only a portion of the routing view of the cabling scheme to the display device.

32. The system of claim 17, further comprising:

receiving a request to display a length of one or more cables in the cabling scheme; and transmitting data representing the length of the one or more cables in the cabling scheme to the display device.

* * * * *